United States Patent
Park et al.

(10) Patent No.: US 7,842,951 B2
(45) Date of Patent: Nov. 30, 2010

(54) TRANSISTOR AND DISPLAY DEVICE HAVING THE SAME

(75) Inventors: Haeng-Won Park, Seongnam-si (KR); Seung-Hwan Moon, Yongin-si (KR); Nam-Soo Kang, Ansan-si (KR); Yong-Soon Lee, Cheonan-si (KR); Back-Won Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 852 days.

(21) Appl. No.: 11/223,524

(22) Filed: Sep. 9, 2005

(65) Prior Publication Data

US 2006/0049404 A1     Mar. 9, 2006

(30) Foreign Application Priority Data

Sep. 9, 2004     (KR)  ................. 10-2004-0072312

(51) Int. Cl.
    *H01L 33/16*     (2010.01)
(52) U.S. Cl. ................ 257/59; 257/60; 257/215; 257/288; 257/291; 257/317; 257/319; 257/72; 257/347; 257/128; 257/E29.117; 257/E29.12; 257/E29.122; 257/E29.273; 349/43; 349/46
(58) Field of Classification Search ............ 257/128
    See application file for complete search history.

(56) References Cited

U.S. PATENT DOCUMENTS

| 5,517,542 | A   |   | 5/1996 | Huq ........................ 377/78 |
| 5,877,512 | A   |   | 3/1999 | Kim |
| 6,239,468 | B1  | * | 5/2001 | Chang et al. ............ 257/347 |
| 6,566,685 | B2  | * | 5/2003 | Morikawa et al. ......... 257/59 |
| 2003/0071236 | A1 | * | 4/2003 | Kido ..................... 251/102 |
| 2004/0173795 | A1 | * | 9/2004 | Moon et al. ............... 257/59 |

FOREIGN PATENT DOCUMENTS

KR     2002-0066962     8/2002

\* cited by examiner

*Primary Examiner*—Victor A Mandala
*Assistant Examiner*—Fei Fei Yeung Lopez
(74) *Attorney, Agent, or Firm*—Cantor Colburn LLP

(57) ABSTRACT

A transistor includes a control electrode, a first current electrode and a second current electrode. The control electrode includes a body portion, and first and second hand portions protruded from first and second ends of the body portion, respectively. The first current electrode is electrically insulated from the control electrode and disposed over a region between the first and second hand portions of the control electrode. A portion of the first current electrode is overlapped with a portion of the control electrode. The second current electrode is electrically insulated from the control electrode and partially overlapped with the body portion, the first hand portion and the second hand portion of the control electrode. Therefore, parasitic capacitance is reduced.

24 Claims, 12 Drawing Sheets

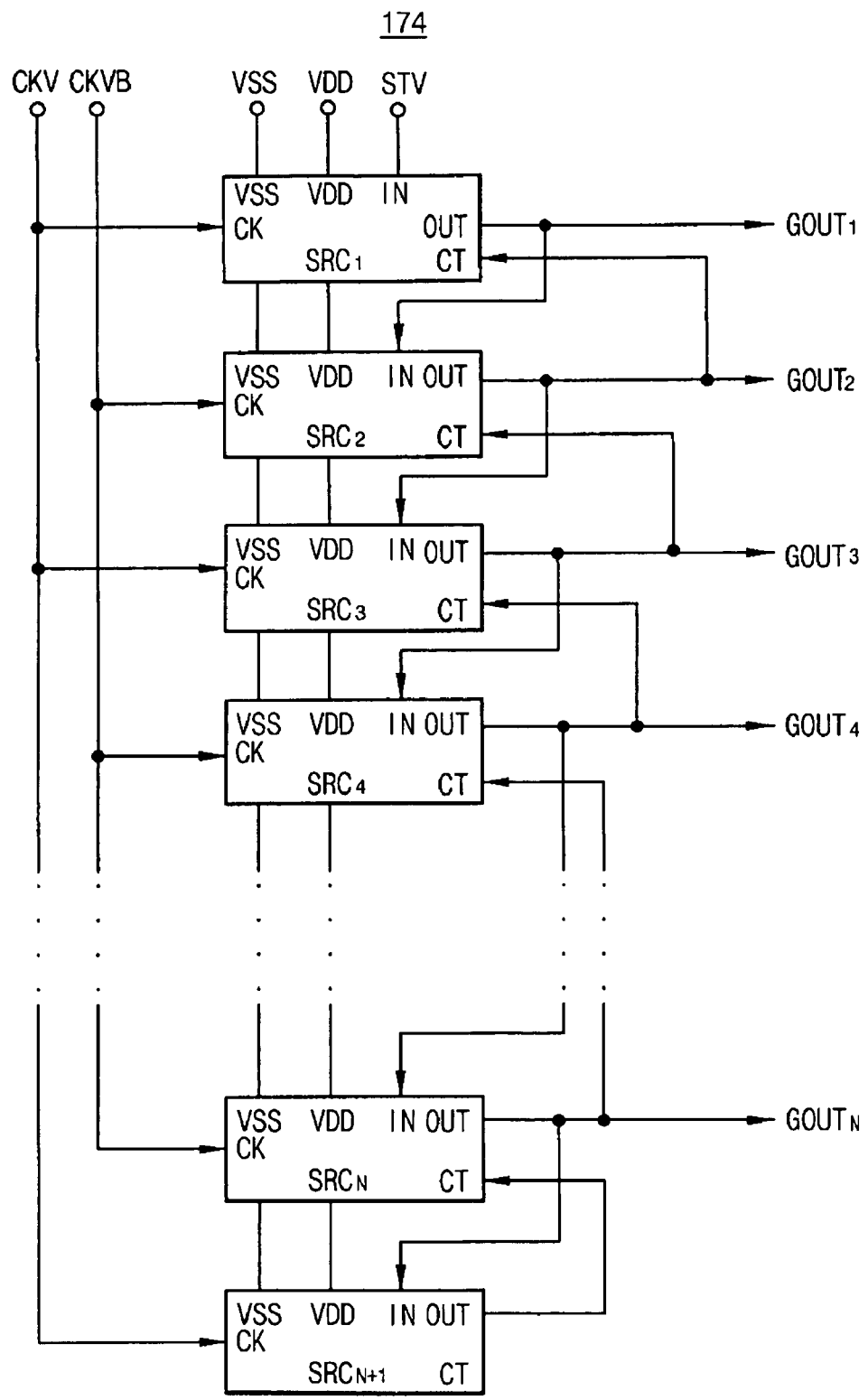

US 7,842,951 B2

TRANSISTOR AND DISPLAY DEVICE HAVING THE SAME

This application claims priority to Korean Patent Application No. 2004-72312 filed on Sep. 9, 2004 and all the benefits accruing therefrom under 35 U.S.C. §119, the contents of which are herein incorporated by reference in its entirety.

BACKGROUND OF THE INVENTION

1. Field of the Invention

The present invention relates to a device for displaying images. More particularly, the present invention relates to a transistor capable of reducing a parasitic capacitance, and a display device having the transistor.

2. Description of the Related Art

A liquid crystal display (LCD) device employs a gate driver integrated circuit (IC). The gate driver IC is formed, for example, through a tape carrier package (TCP), chip on glass (COG), etc.

Recently, in order to reduce manufacturing cost, a gate-IC-less structure has been developed. According to an LCD device employing the gate IC-less structure, while no gate driver IC is employed, an amorphous silicon thin film transistor (a-Si TFT) performs as the gate driver IC.

An a-Si TFT is disclosed in U.S. Pat. No. 5,517,542 and Korean Patent Laid Open Publication No. 2002-66962.

In the above Korean Patent Laid Open Publication No. 2002-66962, a shift register employing only seven a-Si TFT's and wirings connected to the shift register are disclosed.

FIG. 1 is a circuit diagram illustrating a unit stage of a conventional shift register. The unit stage and the conventional shift register are disclosed in Korean Patent Laid Open Publication No. 2002-66962.

Referring to FIG. 1, each stage of a shift register includes a pull up section 110, a pull down section 120, a pull up driving section 130 and a pull down driving section 140. Each stage outputs a gate signal (or scan signal), based on a scan start signal STV or an output signal of a previous stage. In detail, a first stage outputs a first gate signal based on the scan start signal STV provided from a timing control section (not shown). A second stage outputs a second gate signal based on the first gate signal outputted from the first stage. In other words, an (n+1)-th stage outputs an (n+1)-th gate signal based on an n-th gate signal outputted from an n-th stage, wherein 'n' is a natural number.

FIG. 2 is a block diagram illustrating a gate driver circuit including the conventional shift register in FIG. 1.

Referring to FIGS. 1 and 2, a gate driver circuit 174 includes 'N' stages outputting 'N' of gate signals (GOUT1, GOUT2, ..., GOUTN), respectively.

A first stage receives a scan start signal STV, a gate on voltage VDD, a gate off voltage VSS and a first clock signal CKV and outputs a first gate signal GOUT1 for selecting a first gate line. The scan start signal STV, the gate on voltage VDD and the gate off voltage VSS are provided from a timing control section (not shown). The first gate signal GOUT1 is applied to a second stage.

The second stage receives the first gate signal GOUT1, the gate on voltage VDD, the gate off voltage VSS and a second clock signal CKVB, and outputs a second gate signal GOUT2 for selecting a second gate line. The second gate signal GOUT2 is applied to a third stage.

As described above, an N-th stage receives an (N−1)-th gate signal GOUTN−1 provided from an (N−1)-th stage, the gate on voltage VDD, the gate off voltage VSS and the second clock signal CKVB and outputs an N-th gate signal GOUTN for selecting N-th gate line. The N-th gate signal GOUTN is applied to an (N+1)-th stage.

FIG. 3A is a circuit diagram illustrating a unit stage in the conventional shift register in FIG. 1. FIG. 3B is a timing diagram illustrating an operation of the unit stage in FIG. 3A. FIG. 3C is a circuit diagram illustrating a pull down transistor sampling out a first clock signal in FIG. 3A.

Referring to FIGS. 1 through 3C, a unit stage is formed by one S/R latch 21 and one AND-gate 22. The unit stage operates as shown in FIG. 3B.

The S/R latch 21 may include various embodiments but the S/R latch 21 requires a pull down transistor shown in FIG. 3C for sampling a clock signal CK1 by a signal Q outputted from the S/R latch 21.

An NMOS transistor Q1 in the pull up section 110 corresponds to an a-Si TFT. Consequently, the NMOS transistor Q1 has a relatively lower electron mobility. A gate pulse, in a range of about 20V to about −14V, is applied to drive an LCD device having a relatively large size. Increasing a size of the NMOS transistor Q2 is therefore required in order to drive the LCD device.

Particularly, in the case of an LCD device having 12.1 inches (or 30.734 cm) and XGA resolution, a parasitic capacitance of one gate line ranges from about 250 pF to about 300 pF. In order to use a-Si TFT to drive the gate line, a channel width W of at least about 5500 μm is required when a channel length L is about 4 μm, this channel length being an established minimum design rule.

As a result, a parasitic capacitance Cgd between a gate electrode and a drain electrode of the NMOS TFT Q1 increases. The parasitic capacitance Cgd operates as a coupling capacitance between the gate and drain electrodes. The parasitic capacitance Cgd is electrically coupled to the first or second clock CKV or CKVB that is in a range of about 20V to about −14V. If the parasitic capacitance Cgd reaches about 3 pF, a gate driver circuit malfunctions. When a device to maintain gate off voltage VOFF is not provided, since, so that, a voltage of a gate electrode of the pull up transistor Q1 becomes first or second clock CKV or CKVB, ranging from about 20V to about −14V. Output voltage of the pull up transistor Q1 then reaches about 20V-Vth, wherein Vth corresponds to a threshold voltage. As a result, the output voltage of about 20V-Vth is applied to the gate line causing the gate line to malfunction.

Therefore, for the pull up transistor Q1 to have gate off voltage VOFF, a hold transistor Q5 and a pull down transistor Q2 are formed. The hold transistor Q5 corresponds to an a-Si TFT and is sufficiently large to maintain gate off voltage VOFF. The pull down transistor Q2 pulls down a scan pulse to be the gate off voltage VOFF, after the pull up transistor Q1 is operated.

Due to the relatively big size of the transistors Q1 and Q5, forming the gate driver circuit in a black matrix region or a sealing region presents some difficulty. Furthermore, the hold transistor Q5 may deteriorate, inducing malfunction of the LCD device.

SUMMARY OF THE INVENTION

The present invention provides a transistor having a minimized parasitic capacitance.

The present invention also provides a display device having the above-mentioned transistor.

In exemplary embodiments of a transistor, the transistor includes a control electrode, a first current electrode and a second current electrode. The control electrode is formed on a substrate. The control electrode includes a body portion, a first hand portion protruding from a first end of the body portion, and a second hand portion protruded from a second end of the body portion, the second hand portion being substantially parallel with the first hand portion. The first current electrode is disposed between the first and second hand portions of the control electrode. The first current electrode is electrically insulated from the control electrode. The first current electrode partly overlaps with a portion of the control electrode. The second current electrode is disposed over the control electrode and is electrically insulated from the control electrode, the second current election partly overlappinged with the body portion, the first hand portion and the second hand portion of the control electrode.

In an exemplary embodiment, the first current electrode includes a drain electrode of the transistor and the second current electrode includes a source electrode of the transistor.

In another exemplary embodiment, the first current electrode is an I-shape structure partly overlapping with the first and second hand portions of the control electrode.

In another exemplary embodiment, the second current electrode includes a U-shape structure surrounding the I-shape structure of the first current electrode.

In another exemplary embodiment, a distance between the first current electrode and the second current electrode at a region that the second current electrode surrounds the first current electrode is a channel length of the transistor, and a distance along a middle of opposing faces between the first and second current electrodes at a region that the second current electrode surrounds the first current electrode is a channel width of the transistor.

In another exemplary embodiment, the transistor comprises a semiconductor layer having an active layer, and an ohmic contact layer disposed on the active layer, the semiconductor layer being disposed between the control electrode and the first and second electrodes.

In another exemplary embodiment the semiconductor layer is exposed at a region between the first and second current electrodes.

In another exemplary embodiment, the active layer includes an amorphous silicon layer and the ohmic contact layer includes an n+ doped amorphous silicon layer.

In exemplary embodiments of the transistor, the transistor includes a control electrode, a first current electrode and a second current electrode. The control electrode is formed on a substrate. The control electrode includes a body portion and at least two hand portions protruding from the body portion. The first current electrode is electrically insulated from the control electrode. The first current electrode includes at least one hand portion disposed over a region between the hand portions of the control electrode The second current electrode is electrically insulated from the control electrode. The second current electrode is spaced apart from the first current electrode. The second current electrode includes at least one hand portion disposed at a region overlapping with corresponding ones of the hand portions of the control electrode.

In another exemplary embodiment, the hand portion of the first current electrode includes at least one finger portion overlapping with a hand portion of the control electrode.

In another exemplary embodiment, the hand portion of the second current electrode includes finger portions disposed over a hand portion of the control electrode, the finger portion of the first current electrode being surrounded by the finger portions and a part of the second current electrode.

In an exemplary embodiment, distance between the first current electrode and the second current electrode at a region that the second current electrode surrounds the first current electrode is a channel length of the transistor, and a distance along a middle of opposing faces between the first and second current electrode at the region that the second current electrode surrounds the first current electrode is a channel width of the transistor.

In another exemplary embodiment, the first current electrode includes, a body portion, a hand portion and a finger portion. The body portion is extended toward the control electrode. The hand portion protrudes from the body portion of the current electrode. The finger portion protrudes from the hand portion of the first current electrode, the finger portion being disposed over the control electrode.

In another exemplary embodiment, the second current electrode includes a body portion, a hand portion and a finger portion. The body portion extends toward the control electrode. The hand portion protrudes from the body portion of the second current electrode. The finger portion protrudes from the hand portion of the second current electrode. The hand portion and the finger portion of the second current electrode are disposed over the control electrode.

In another exemplary embodiment, the first current electrode includes a finger portion overlapping with the control electrode. The second current electrode includes a hand portion overlapping with the control electrode and a finger portion protruding from the hand portion of the second current electrode, the hand portion of the second current electrode overlapping with the control electrode. The finger portion of the first current electrode is surrounded by the hand portion and the finger portion of the second current electrode.

In another exemplary embodiment, the control electrode includes outermost hand portions protruding from two end of the body portion of the control electrode and at least one inner hand portion protruding from a center of the body portion. The second current electrode includes outermost hand portions disposed over the outermost hand portions of the control electrode at least one inner hand portion overlapping with the at least one inner hand portion of the control electrode.

In another exemplary embodiment, the transistor includes a semiconductor layer including an active layer and an ohmic contact layer disposed on the active layer, the semiconductor layer being disposed between the control electrode and the first and second electrodes.

In other embodiments, the active layer includes an amorphous silicon layer and the ohmic layer includes an n+ doped amorphous silicon layer.

In another exemplary embodiment, the control electrode includes a first hand portion, a second hand portion a third hand portion. The first hand portion protrudes from a first end of the body portion. The second hand portion protrudes from a center of the body portion. The third hand portion protrudes form a second end of the body portion, which is opposite to the first end portion with respect to the second hand portion.

In another exemplary embodiment, first current electrode includes a body portion disposed adjacent to the control electrode, a first hand portion protruding from the body portion in a direction substantially perpendicular to the body portion, the first hand portion of the first current electrode being disposed over a region between the first and second hand portions of the control electrode, and a second hand portion protruding from the body portion in a direction substantially parallel with the first hand portion of the first current electrode, the second hand portion of the first current electrode being disposed over a region between the second and third hand portions of the control electrode.

In another exemplary embodiment the first hand portion of the first current electrode includes a first finger portion protruding from the first hand portion of the first current electrode in a direction substantially perpendicular to the first hand portion of the first current electrode, the first finger portion being disposed at a region overlapping with a part of the first hand portion of the control electrode, and a second finger portion protruding from the first hand portion of the first current electrode in a direction substantially opposite the first current electrode in a direction substantially opposite the first finger portion of the first current electrode, the second finger portion of the first current electrode being disposed at a region overlapping with a part of the second hand portion of the control electrode.

In another exemplary embodiment the second hand portion of the first current electrode includes a third finger portion protruding from the second hand portion of the first current electrode in a direction substantially perpendicular to the second hand portion of the first current electrode, the third finger portion of the first current electrode being disposed at a region overlapping with a part of the second hand portion of the control electrode. The second hand portion of the first current electrode also includes a fourth finger portion protruding from the second hand portion of the first current electrode in a direction substantially opposite the third finger portion of the first current electrode, the fourth finger portion of the first current electrode being disposed at a region overlapping with a part of the third hand portion of the control electrode.

In another exemplary embodiment the second current electrode includes a body portion disposed over the body portion of the control electrode, a first hand portion protruding from the body portion of the second current electrode in a direction substantially perpendicular to the body portion of the second current electrode, the first hand portion of the second current electrode being disposed at a region overlapping the first hand portion of the control electrode, a second hand portion protruding from the body portion of the second current electrode in a direction substantially parallel with the first hand portion of the second current electrode, the second hand portion of the second current electrode being disposed at a region overlapping the second hand portion of the control electrode, and a third hand portion protruding from the body portion of the second current electrode in a direction substantially parallel with the first and second hand portions of the second current electrode, the third hand portion of the second current electrode being disposed at a region overlapping the third hand portion of the control electrode.

In another exemplary embodiment, the first hand portion of the second current electrode includes first finger portions each protruding from the first hand portion of the second current electrode in a direction substantially perpendicular to the first hand portion of the second current electrode, the second hand portion of the second current electrode includes second finger portions each protruding from the second hand portion of the second current electrode in a direction substantially perpendicular to the second hand portion of the second current electrode, and third finger portions each protruding from the second hand portion of the second current electrode in a direction substantially opposite the second finger portions of the second current electrode, and the third hand portion of the second current electrode includes fourth finger portions each protruding from the third hand portion of the second current electrode in a direction substantially perpendicular to the third hand portion of the second current electrode.

In another exemplary embodiment the first current electrode includes a first hand portion having first and second finger portions that are disposed at regions overlapping the first and second hand portions, respectively, of the control electrode, the first finger portion of the first current electrode being disposed between adjacent ones of the first finger portions of the second current electrode, and the second finger portion of the first current electrode being disposed between adjacent ones of the second finger portions of the second current electrode.

In another exemplary embodiment the first current electrode includes a second hand portion having third and fourth finger portions that are disposed at regions overlapping the second and third hand portions, respectively, of the control electrode, the third finger portion of the first current electrode being disposed between adjacent ones of the third finger portions of the second current electrode, and the fourth finger portion of the first current electrode being disposed between adjacent ones of the fourth finger portions of the second current electrode. In an exemplary display device, the display device includes a display cell array circuit and a gate driving circuit. The display cell array circuit is formed on a substrate. The display cell array circuit includes a plurality of data lines and a plurality of gate lines. The gate driving circuit is formed on the substrate. The gate driving circuit includes a plurality of shift registers. Each of the shift register applies gate signals to the gate lines of the display cell array circuit in sequence by one of a first clock signal and a second clock signal when a scan start signal is applied to a first shift register. Each of the shift register includes a driving section, a discharging section and a holding section. The driving section includes a transistor having a drain electrode, a source electrode and a gate electrode. The driving section outputs an output signal in response to one of the first and second clock signals, when the driving section receives the scan start signal or an output signal of a previous stage. The discharge section is electrically discharged in response to an output signal of a next stage. The holding section holds the output signal of the driving section, the output signal of the driving section becoming a first source voltage.

In another exemplary embodiment, the transistor includes a control electrode, a first current electrode and a second current electrode. The control electrode is formed on a substrate. The control electrode includes a body portion, a first hand portion protruding from a first end of the body portion, and a second hand portion protruding from a second end of the body portion, the second hand portion being substantially parallel with the first hand portion. The first current electrode is electrically insulated from the control electrode and disposed over a region between the first and second hand portions of the control electrode. A portion of the first current electrode overlaps with a portion of the control electrode. The second current electrode is electrically insulated from the control electrode, a portion of the second current electrode overlapping with the body portion, the first hand portion and the second hand portion of the control electrode.

In another exemplary embodiment, the transistor includes a control electrode, a first current electrode and a second current electrode. The control electrode is formed on a substrate. The control electrode includes a body portion and at least two hand portions protruding from the body portion. The first current electrode is electrically insulated from the control electrode. The first current electrode includes hand portions extended toward the control electrode and including a finger portion that is overlapped with the control electrode. The second current electrode is electrically insulated from the control electrode. The second current electrode is extended toward the control electrode and spaced apart from the first current electrode. The second current electrode having a finger portion is overlapped with the body portion and outermost hand portions of the control electrode.

In another exemplary embodiment, the transistor includes a control electrode, and a second current electrode. A part of the second current electrode protrudes over the outermost hand portions. The second current electrode is formed on the inner hand portion, a first part of the second current electrode protruding to be overlapped with the outermost hand portion. Therefore, parasitic capacitance is reduced.

BRIEF DESCRIPTION OF THE DRAWINGS

The above and other features and advantages of the present invention will become more apparent by describing in detailed exemplary embodiments thereof with reference to the accompanying drawings, in which:

FIG. 2 is a block diagram illustrating a gate driver circuit of the prior art including the conventional shift register in FIG. 1;

DETAILED DESCRIPTION OF THE INVENTION

It should be understood that the exemplary embodiments of the present is invention described below may be varied in many different ways without departing from the inventive principles disclosed herein, and the scope of the present invention is therefore not limited to these particular flowing embodiments. Rather, these embodiments are provided so that this disclosure will be thorough and complete, and will fully convey the concept of the invention to those skilled in the art by way of example and not of limitation.

Hereinafter, embodiments of the present invention will be described in detail with reference to the accompanied drawings. It is noted that various changes, substitutions and alterations may be made herein without departing from the spirit and scope of the invention as defined by the embodiments described below. The embodiments are examples for showing the spirit of the present invention to a person skilled in the art. In the figures, a thickness of a layer may be exaggerated for clarity. The term "disposed on" means "disposed over". In other words, something may be disposed therebetween. Similarly, "disposed under" means something may be disposed therebetween. The term "disposed directly on" means that nothing is disposed therebetween.

Figure 4:
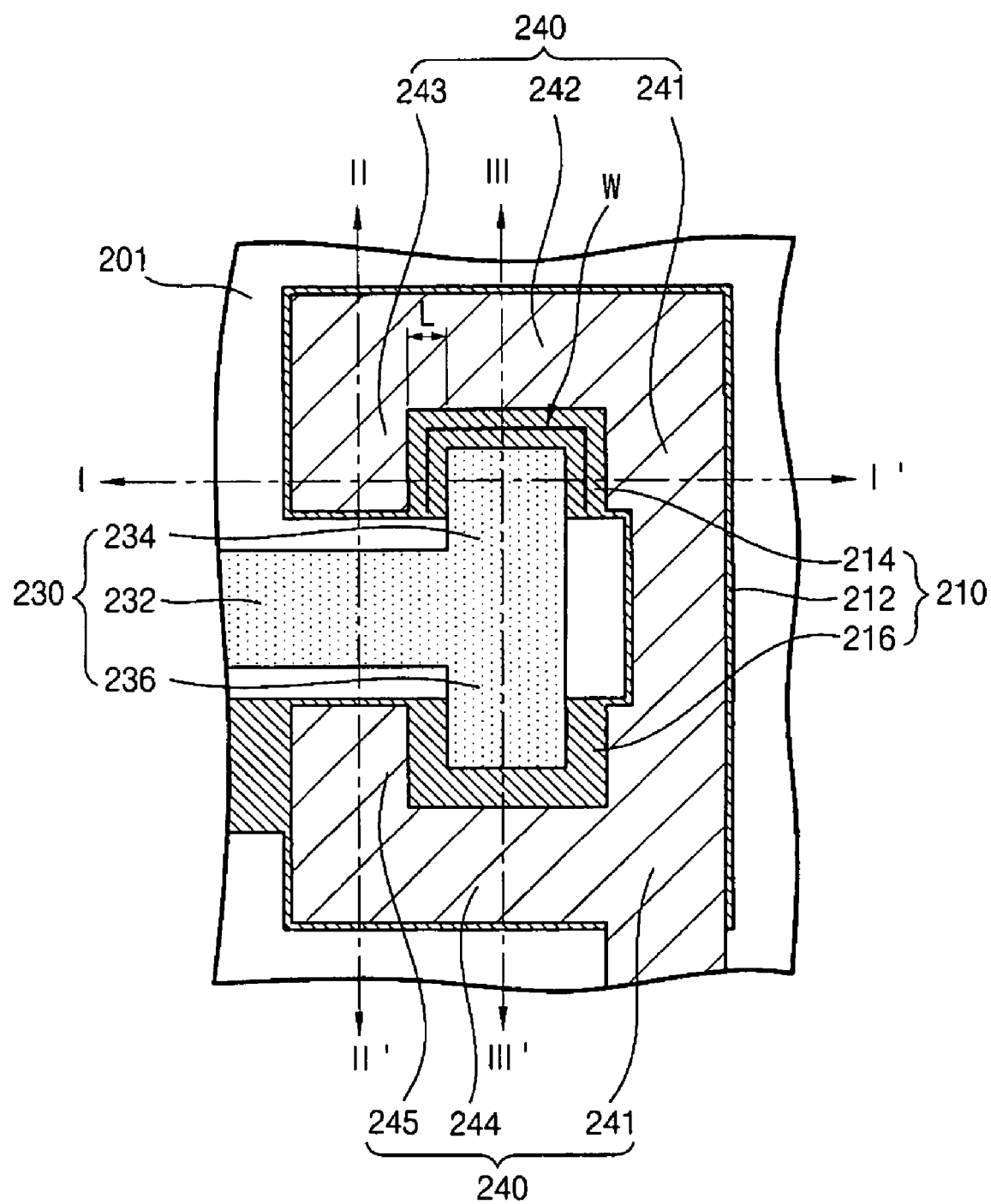
FIG. 4 is a layout illustrating an exemplary embodiment of an amorphous silicon thin film transistor (a-Si TFT) according to the present invention.

FIG. 4 is a layout illustrating an exemplary embodiment of an amorphous silicon thin film transistor (a-Si TFT) according to the present invention. The a-Si TFT according to the present invention reduces a parasitic capacitance and ensures a positioning margin.

Referring to FIG. 4, an a-Si TFT 200 includes a gate electrode 210, a drain electrode 230 and a source electrode 240. The gate electrode 210 may have, for example, a U-shape. The drain electrode 230 is extended toward the gate electrode 210 to cover a portion of the gate electrode 210. The source electrode 240 is disposed over the gate electrode 210. The source electrode 240 is spaced apart from and surrounds the drain electrode 230. The source electrode 240 may have a C-shape as shown in FIG. 4, while not necessary to. In FIG. 4, only elements including metal such as the gate electrode 210, the drain electrode 230 and the source electrode 240 are illustrated for convenience. That is, a gate insulation layer, an active layer, an ohmic contact layer are not illustrated. Additionally, a size of the gate electrode 210 is exaggerated in order that the gate electrode 210 is to be illustrated.

The gate electrode 210 is formed on a substrate 201. The gate electrode 210 includes a gate body portion 212, a first gate hand portion 214 and a second gate hand portion 216. The second gate hand portion 216 is substantially parallel with the first gate hand portion 214. The first and second gate hand portions 214 and 216 are extended from a first end and a second end of the first body portion 212, respectively, so that the gate electrode 210 has an U-shape as shown in the exemplary embodiment of FIG. 4. Of course, in alternative embodiments, the first and second gate hand portions 214,216 may not be parallel. Shapes of the gate electrode 210 other than U-shaped are also contemplated for alternative embodiments.

The drain electrode 230 is formed over the substrate 201. The drain electrode 230 includes a drain body portion 232, a first drain hand portion 234 and a second drain hand portion 236. The second drain hand portion 236 is substantially in parallel with the first drain hand portion 234. The first and second drain hand portions 234 and 236 are extended opposite to each other from an end portion of the drain body portion 232, so that the drain electrode 230 has a T-shape as shown in the exemplary embodiment of FIG. 4.

The source electrode 240 includes a source body portion 241, a first source hand portion 242, a second source hand portion 244, a first source finger portion 243 and a second source finger portion 245. The source body portion 241 is extended toward the gate electrode 210 and disposed over the gate electrode 210. The first source hand portion 242 is extended from an end portion of the source body portion 241. The first source hand portion 242 is substantially perpendicular to the first body portion 241. The first source finger portion 243 is extended from an end portion of the first source hand portion 242 in a direction substantially parallel with the source body portion 241.

The second source hand portion 244 is extended in a direction substantially parallel with the first source hand portion 242. The first and second source hand portions 242 and 244 are disposed opposite to each other with respect to the drain electrode 230.

The second source finger portion 245 is extended from an end portion of the second source hand portion 244 in a direction substantially parallel with the source body portion 241.

The first drain hand portion 234 is disposed over the gate electrode 210 and surrounded by the first source body portion 241, the first source hand portion 242 and the first source finger portion 243, defining a channel having a channel width 'W' and a channel length 'L'.

In a similar manner, the second drain hand portion 236 is disposed over the gate electrode 210 and surrounded by the second source body portion 241, the second source hand portion 244 and the second source finger portion 245, defining a channel having a channel width 'W' and a channel length 'L'.

In the exemplary embodiment in FIG. 4, channel width 'W' is indicated by a darkened line. The channel width 'W' is defined at an average distance along a middle of corresponding opposing faces between the first drain hand portion 234 and the first source finger, hand and body portions 243, 242 and 241, respectively. The channel length 'L' is defined as a distance generally between corresponding opposing faces of the first drain hand portion 234 and the first source finger, hand and body, 243, 242 and 241, respectively.

As described above, when the drain electrode 230 has a T-shape or I-shape, and the source electrode 210 has C-shape or U-shape surrounding the drain electrode 230, a ratio of the channel width 'W' to the channel length 'L' is increased to reduce a parasitic capacitance of a-Si TFT.

In another exemplary embodiment, a method of manufacturing an a-Si TFT will be explained.

Figure 5A:
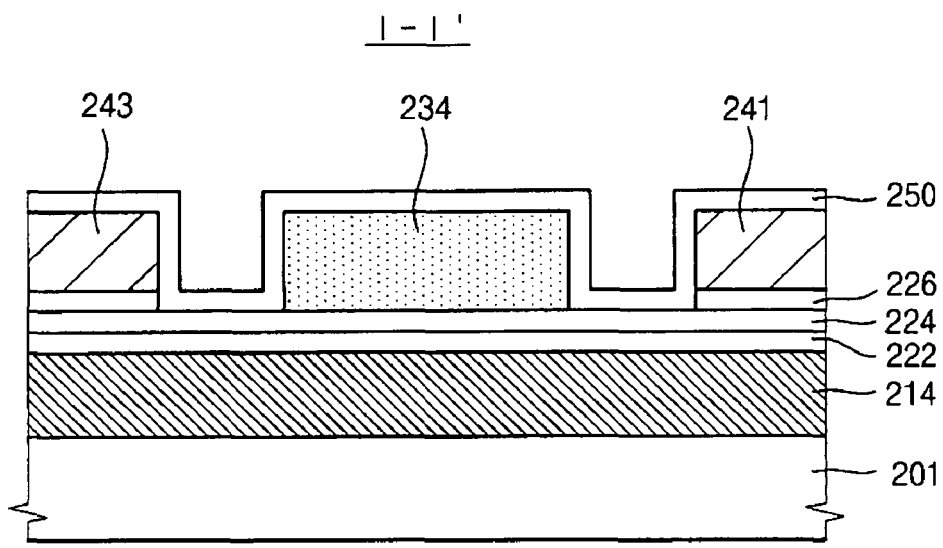
FIGS. 5A, 5B and 5C are cross-sectional views illustrating the exemplary a-Si TFT in FIG. 4.
Figure 5B:
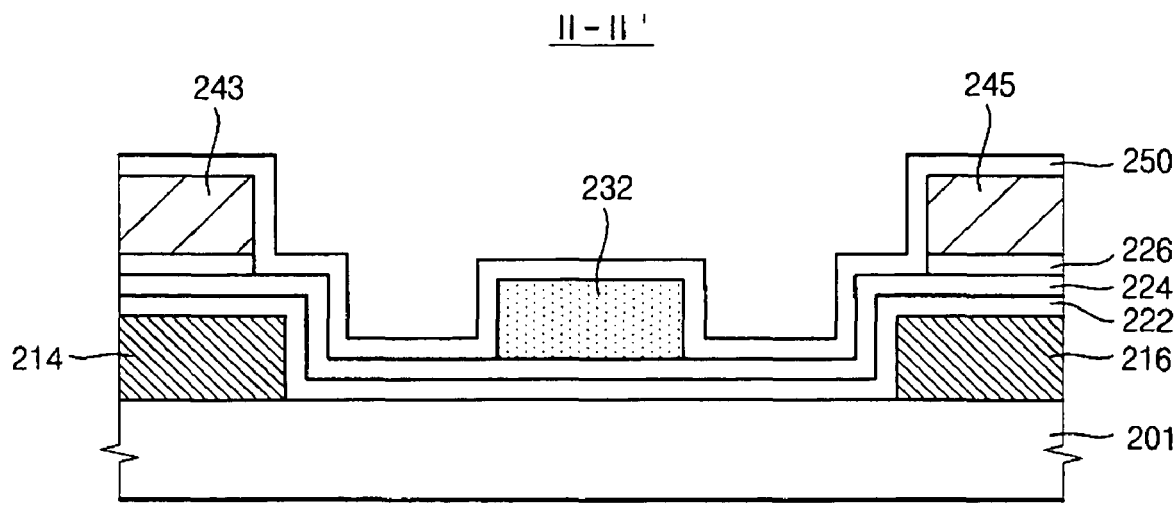
Figure 5C:
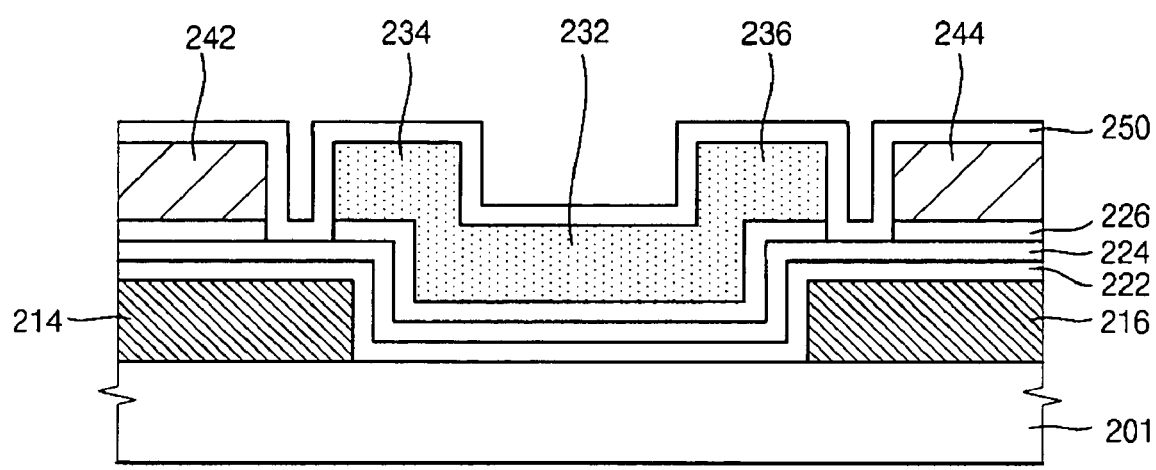

FIGS. 5A, 5B and 5C are cross-sectional views illustrating the a-Si TFT in FIG. 4. In detail, FIG. 5A is a cross-sectional view taken along line I-I' in FIG. 4, FIG. 5B is a cross-sectional view taken along line II-II' in FIG. 4, and FIG. 5C is a cross-sectional view taken along line III-III' in FIG. 4.

Referring to FIGS. 4, 5A, 5B and 5C, a metal layer (not shown) is formed on the substrate 201. Examples of a metal that can be used for the metal layer include aluminum (Al), aluminum alloy, silver (Ag), silver alloy, copper (Cu), copper alloy, molybdenum (Mo), molybdenum alloy, chromium (Cr), tantalum (Ta), titanium (Ti) and the like. These can be used alone or in a combination thereof. The metal layer is patterned to form the gate electrode 210.

The gate electrode 210 may have at least two layers having different characters. For example, the gate electrode 210 may include an upper layer including, but not limited to, a metal that has a relatively low electric resistivity such as aluminum (Al), aluminum alloy, silver (Ag), silver alloy, copper (Cu), copper alloy, or the like, as well as combinations including at least one of the foregoing, and a lower layer including, but not limited to, a material having a relatively good contact characteristics such as molybdenum (Mo), molybdenum alloy, chromium (Cr), tantalum (Ta), titanium (Ti), or the like, as well as combinations including at least one of the foregoing. The gate electrode 210 typically includes the lower layer including chromium (Cr) and the upper layer including aluminum neodymium alloy (AlNd), or the lower layer including aluminum neodymium alloy (AlNd) and the upper layer including molybdenum (Mo).

Then, a gate insulation layer 222 is formed on the substrate 201 as shown for example in FIGS. 5A-5C. Where the gate electrode 210 is formed on the substrate 201, the gate insulation layer 222 may be formed on the gate electrode 210 as shown in FIGS. 5A-5C. The gate insulation layer 222 may include, but is not limited to silicon oxide (SiOx) or silicon nitride (SiNx).

An active layer 224 including but not limited to, amorphous silicon (a-Si:H) is formed on the gate insulation layer 222. Then, an ohmic contact layer 226 including but not limited to, n+ doped amorphous silicon (n+ a-Si:H) is formed on the active layer 224.

A metal layer, including but not limited to, refractory metal such as molybdenum (Mo), chromium (Cr), tantalum (Ta), titanium (Ti), is formed, and patterned to form the drain electrode 230 and the source electrode 240. The drain electrode 230 is formed over the substrate 210. The drain electrode 230 may be configured in a similar manner as previously discussed with regard to the exemplary embodiment of FIG. 4. Other embodiments are also contemplated.

The source electrode 240 may also be configured in a similar manner as previously discussed with regard to the exemplary embodiment of FIG. 4. Other embodiments are also contemplated.

A portion of the ohmic contact layer 226 between the drain and source electrodes 230 and 240, is removed by using the drain and source electrodes 230 and 240 as a mask. As best shown in FIG. 5C, the removal of the ohmic contact layer 226 may expose the active layer 224 between the drain electrode 232,234,236 and source electrode 242,244.

Then, a protection layer 250 is formed over the substrate 201, the substrate 201 having the drain and source electrodes 230 and 240 also formed thereon. Where a portion of the ohmic contact layer 226 has been removed and the active layer 224 exposed, the protection layer 250 may be formed directly on the active layer 224 as shown in FIG. 5C. The protection layer 250 may include, but is not limited to silicon nitride (SiNx), silicon oxide (SiOx), and the like, or any combination of at least one of the foregoing.

The a-Si TFT described above corresponds to an inversed staggered type TFT having a gate electrode disposed under the drain and source electrodes. However, in other alternative embodiments, a structure of the exemplary a-Si TFT and exemplary method described above may be applied to a staggered type TFT.

Hereinafter, another exemplary embodiment of an a-Si TFT capable of increasing a channel width and minimizing a parasitic capacitance Cgd will be explained. This exemplary a-Si TFT may be employed by a gate driving circuit of a display apparatus. By way of example only, a pull up transistor will is discussed below.

Figure 6:
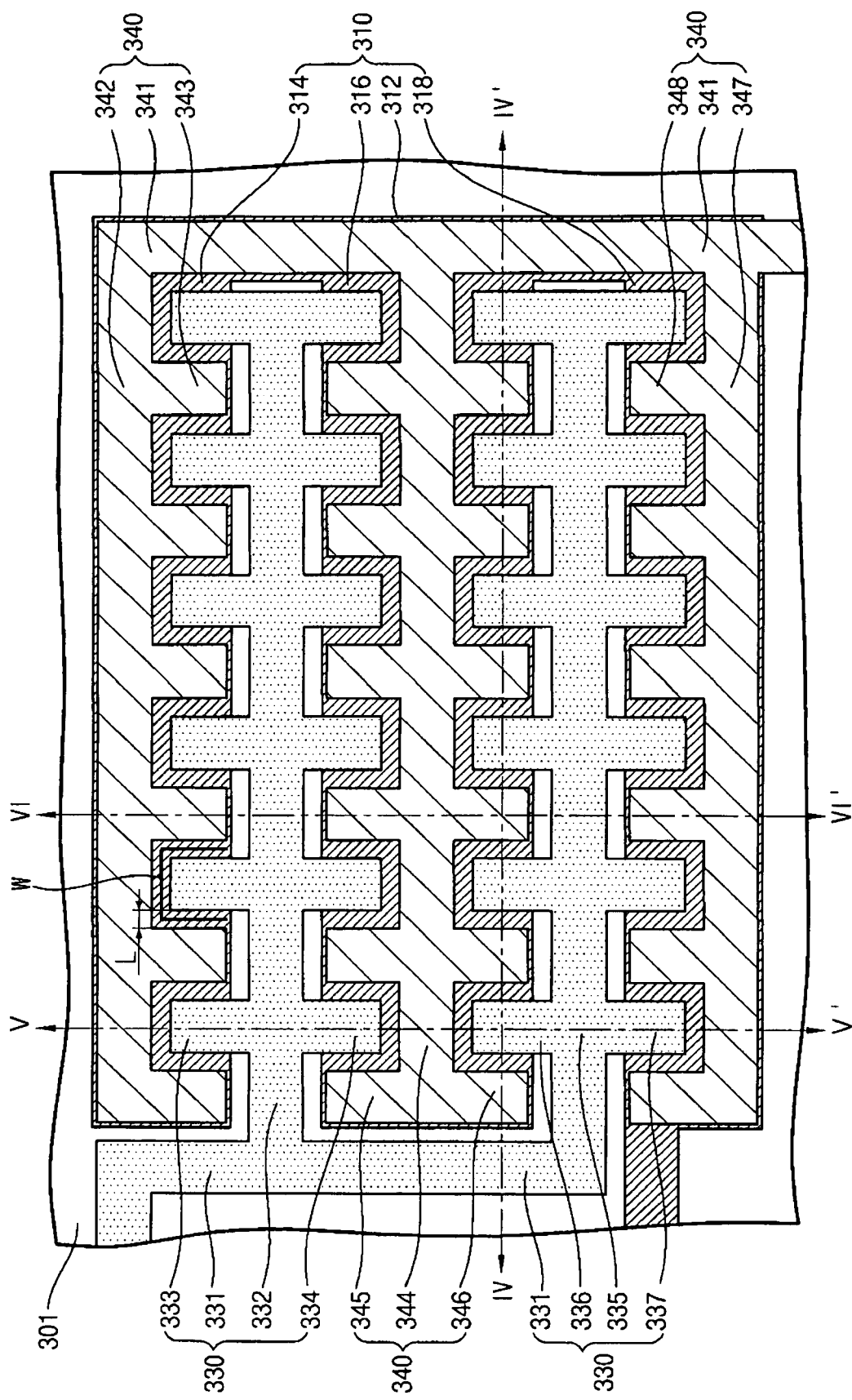
FIG. 6 is a layout illustrating another exemplary embodiment of an a-Si TFT according to the present invention.

FIG. 6 is a layout illustrating another exemplary embodiment of an a-Si TFT. The exemplary a-Si TFT in FIG. 6 may be employed by a shift register formed on a substrate of an LCD panel.

Referring to FIG. 6, an exemplary embodiment of an a-Si TFT includes a gate electrode 310, a drain electrode 330 and a source electrode 340. The gate electrode 310 is formed on a substrate 301. The drain electrode 330 is extended toward the gate electrode 310, so that a portion of the drain electrode 330 is disposed over the gate electrode 310. The source electrode 340 is spaced apart from the drain electrode 330. The source electrode 340 is extended toward the gate electrode 310, so that a portion of the source electrode 340 is disposed over the gate electrode 310. In FIG. 6, only elements including metal such as the gate electrode 310, the drain electrode 330 and the source electrode 340 are illustrated for convenience. That is, a gate insulation layer, an active layer, an ohmic contact layer are not illustrated. Additionally, a size of the gate electrode 310 is exaggerated in order that the gate electrode 310 is to be illustrated.

The gate electrode 310 is shown in FIG. 6 having an E-shape, but the gate electrode 310 may have configurations of other shapes.

Particularly, the gate electrode 310 includes a gate body portion 312, a first gate hand portion 314, a second gate hand portion 316 and a third gate hand portion 318. The first, second and third gate hand portions 314, 316 and 318 are protruded from the gate body portion 312 such that the first, second and third gate hand portions 314, 316 and 318 are substantially in parallel with each other. This configuration, as an example, defines the gate electrode 310 having the E-shape mentioned above.

The drain electrode 330 includes a drain body portion 331, a first drain hand portion 332 and a second drain hand portion 335. The first drain hand portion 332 is protruded from the drain body portion 331 such that the first drain hand portion 332 is substantially perpendicular to the drain body portion 331. As shown similarly in the exemplary embodiment of FIG. 6, the second drain hand portion 335 is protruded from the drain body portion 331 such that the second drain hand portion 335 is substantially in parallel with the first drain hand portion 332. Of course, in alternative embodiments, the first drain hand portion 332 and second drain hand portion 335 may not be parallel.

The first drain hand portion 332 includes a plurality of first drain finger portions 333 and a plurality of second drain finger portions 334. Each of the first drain finger portions 333 is protruded from the first drain hand portion 332 such that the first drain finger portions 333 are substantially perpendicular to the first drain hand portion 332 along a first direction. As shown similarly in the exemplary embodiment of FIG. 6, each of the second drain finger portions 334 is protruded from the first drain hand portion 332 such that the second drain finger portions 334 are substantially perpendicular to the first drain hand portion 332 along a second direction that is opposite to the first direction.

The second drain hand portion 335 includes a plurality of third drain finger portions 336 and a plurality of fourth drain finger portions 337. Each of the third drain finger portions 336 is protruded from the second drain hand portion 335 such that the third drain finger portions 336 are substantially perpendicular to the second drain hand portion 335 along the first direction. As shown similarly in the exemplary embodiment of FIG. 6, each of the fourth drain finger portions 337 is protruded from the second drain hand portion 335 such that the fourth drain finger portions 337 are substantially perpendicular to the second drain hand portion 335 along the second direction that is opposite to the first direction.

Of course, in alternative embodiments, the first, second, third, and/or fourth drain finger portions, 333, 334, 336 and 337, respectively, may not be perpendicular to the first 332 and/or second 335 drain hand portion. As shown in the exemplary embodiment of FIG. 6, the source electrode 340 includes a source body portion 341, first source hand portion 342, a second source hand portion 344 and a third source hand portion 347. The source body portion 341 is disposed over the gate body portion 312. The first, second and third source hand portions 342, 344 and 347 are disposed over the first, second and third gate hand portions 314, 316 and 318, respectively. The first drain hand portion 332 is disposed between the first and second source hand portions 342 and 344. The second drain hand portion 335 is disposed between the second and third source hand portions 344 and 347.

The source electrode 340 includes a plurality of finger shapes, such as those shown in the exemplary embodiment of FIG. 6 as 343, 345, 346, and 348. A portion of the drain electrode 330 and a portion of the source electrode 340 are disposed over the gate electrode 310 such that the portion of the drain electrode 330 alternates with the portion of the source electrode 340 when viewed in a top view, such as in FIG. 6. The source electrode 340 surrounds the drain electrode 330, when viewed on a plane.

The first source hand portion 342 includes a plurality of first source finger portions 343. The first source finger portions 343 protrude from the first source hand portion 342 in a direction of the first drain hand portion 332, such that the first source finger portions 343 are substantially perpendicular to the first source hand portion 342. In the exemplary embodiment of FIG. 6, each of the first drain finger portions 333 is disposed between consecutive first source finger portions 343. In other words, each first drain finger portion 333 is disposed between adjacent first source finger portions 343.

The second source hand portion 344 includes a plurality of second source finger portions 345 and a plurality of third source finger portions 346. The second source finger portions 345 protrude from the second source hand portion 344 in a direction of the first drain hand portion 332, such that the second source finger portions 345 are substantially perpendicular to the second source hand portion 344. Each of the second drain finger portions 334 is disposed between adjacent second source finger portions 345. In a similar manner as shown in FIG. 6, the third source finger portions 346 protrude from the second source hand portion 344 in a d direction of the second drain hand portion 335 such that the third source finger portions 346 are substantially perpendicular to the second source hand portion 344. Each of the third drain finger portions 336 is disposed between adjacent third source finger portions 346.

Finally, as shown in the exemplary embodiment of FIG. 6, the third source hand portion 347 includes a plurality of fourth source finger portions 348. The fourth source finger portions 348 protrude from the third source hand portion 347 in a direction of the second drain hand portion 335, such that the fourth source finger portions 348 are substantially perpendicular to the third source hand portion 347. Each of the fourth drain finger portions 337 is disposed between adjacent fourth source finger portions 348.

In one exemplary embodiment, corresponding first and second drain finger portions 333 and 334, along with a part of the first drain hand portion 332 form an I-shape, such as is shown in FIG. 6. Of course, configurations of than an I-shape may also be used. Consecutive first source finger portions 343 and a part of the first source hand portion 342 form a U-shape surrounding the first drain finger portion 333 which is a part of the I-shape described above.

In a similar configuration in FIG. 6, second, third and fourth source finger portions 345, 346 and 348, along with a part of the second 344 or third 347 source hand portions form a U-shape surrounding the respective source finger portion. This U-shape configuration defines a channel with channel width 'W' and the channel length 'L'.

In the exemplary embodiment in FIG. 6, channel width 'W' is indicated by a darkened line. The channel width 'W' is defined at an average distance along a middle of corresponding opposing faces between the first drain finger portion 333, and the consecutive first source finger portions 343 and the first source hand portion 342. The channel length 'L' is defined as a distance generally between corresponding opposing faces of the first drain finger portion 333, and the first source finger portions 343 and the first source hand portion 342.

In this embodiment, each of the second drain finger portions 334 may have an I-shape, and disposed between adjacent second source finger portions 345. The adjacent second source finger portions 345, and a part of the second source hand portion 344 form a U-shape surrounding the second drain finger portion 334 having I-shape to define the channel width 'W' and the channel length 'L' of a thin film transistor. In detail, the channel width 'W' is defined at an average distance along a middle of opposing faces between the second drain finger portions 334 second source finger portions 345, and the second source hand portion 344. d The channel length 'L' is defined at a distance corresponding to opposing faces of the second drain finger portion 334, the second source finger portion 345 and the second source hand portion 344.

Also, each of the third drain finger portions 336 may have an I-shape, and be disposed between adjacent third source finger portions 346. The adjacent third source finger portions 346, and a part of the second source hand portion 344 form a U-shape surrounding the third drain finger portion 336 having I-shape to define the channel width 'W' and the channel length 'L' of a thin film transistor. In detail, the channel width 'W' is defined at an average distance along a middle of opposing faces between the third drain finger portion 336, the third source finger portions 346, and the second source hand portion 344. The channel length 'L' is defined at a distance between corresponding opposing faces of the third drain finger portion 336, the third source finger portions 346 and the second source hand portion 344. Also, each of the fourth drain finger portions 337 may have an I-shape, and be disposed between adjacent fourth source finger portions 348. The adjacent fourth source finger portions 348, and a part of the third source hand portion 347 form a U-shape surrounding the fourth drain finger portion 337 having I-shape to define the channel width 'W' and the channel length 'L' of a thin film transistor. In detail, the channel width 'W' is defined at an average distance along a middle of opposing faces between the fourth drain finger portion 337, the fourth source finger portions 348, and the third source hand portion 347. The channel length 'L' is defined at a distance between corresponding opposing faces of the fourth drain finger portion 337, the fourth source finger portions 348 and the third source hand portion 347.

In the exemplary embodiments discussed above, the a-Si TFT may be employed as a pull up transistor of a unit stage of a shift register that is formed directly on a liquid crystal display panel. In alternative embodiments, a pull down transistor or a hold transistor may employ same or similar structure described above.

As described above, when the a-Si TFT includes the first, second, third and fourth drain finger portions 333, 334, 336 and 337, and the first, second, third and fourth source finger portions 343, 345, 346 and 348, a channel width of about n×4 μm may be formed without increasing a parasitic capacitance Cgd, wherein 'n' represents a total number of the first, second, third and fourth drain finger portions 333, 334, 336 and 337, and the first, second, third and fourth source finger portions 343, 345, 346 and 348. In other words, when a drain finger portion is designed to have a minimum design rule of about 4 μm and a source hand portion and source finger portions face three sides of the drain finger portion, respectively, a channel width of about 3×4 μm is generated without increasing the parasitic capacitance Cgd. Of course, other embodiments are contemplated.

In an additional embodiment, when a liquid crystal display panel employs a shift register, having a pull down transistor including the above a-Si TFT formed directly on the liquid crystal panel, a parasitic capacitance that is electrically coupled with a power clock signal CK1 or CK2 is reduced. This is an advantageous result of the a-Si TFT having minimal parasitic capacitance Cgd as described above. Therefore, a malfunction of the shift register is reduced or effectively prevented.

In another exemplary embodiment, a method of manufacturing the a-Si TFT is provided below.

Figure 7A:
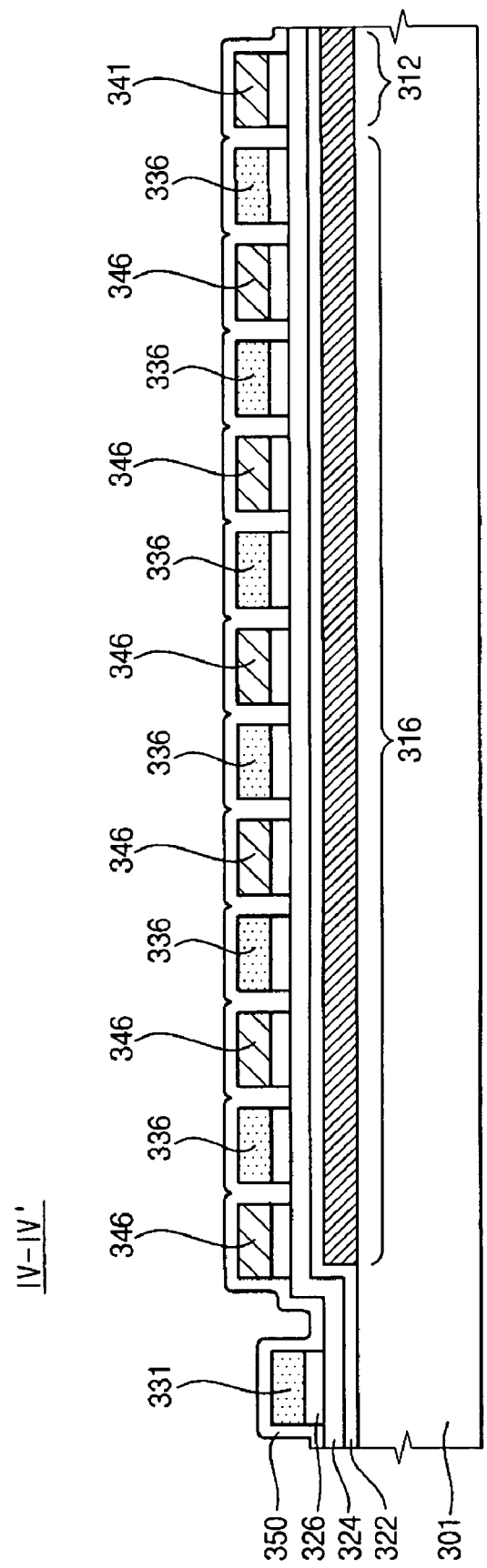
FIGS. 7A through 7C are cross-sectional views illustrating the exemplary a-Si TFT in FIG. 6.
Figure 7B:
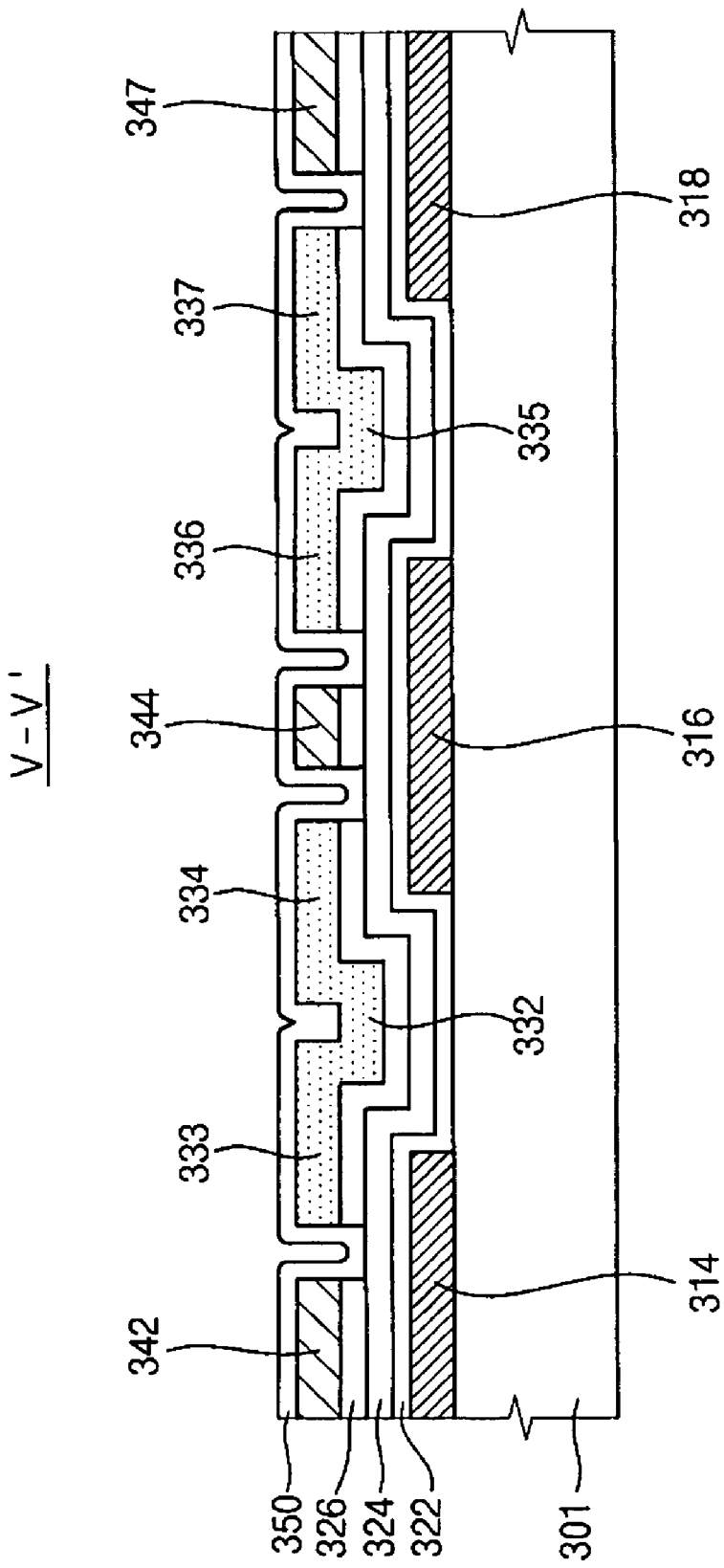
Figure 7C:
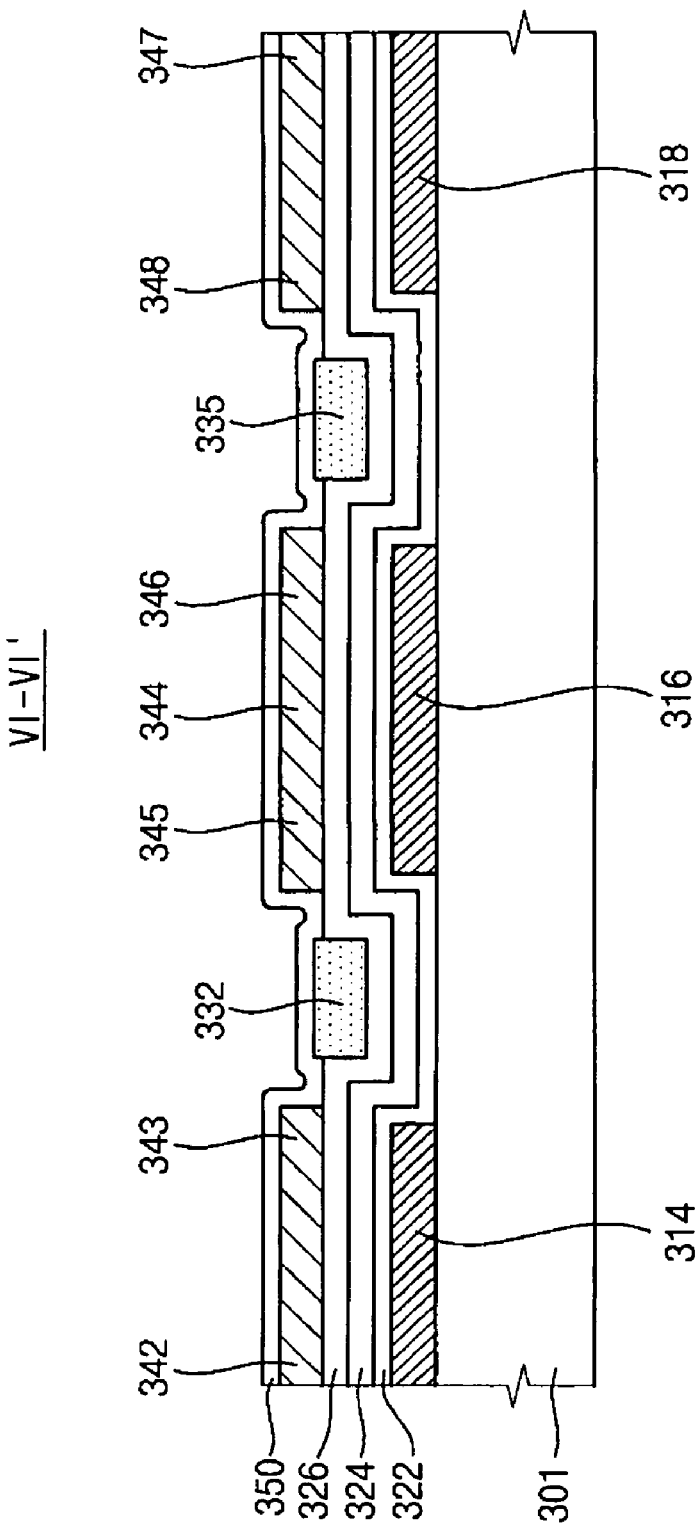

FIGS. 7A through 7C are cross-sectional views illustrating the exemplary a-Si TFT in FIG. 6. In detail, FIG. 7A is a cross-sectional view taken along line IV-IV' in FIG. 6, FIG. 7B is a cross-sectional view taken along line V-V' in FIG. 6, and FIG. 7C is a cross-sectional view taken along line VI-VI' in FIG. 6.

Referring to FIGS. 6, 7A, 7B and 7C, a metal layer (not shown) is formed on the substrate 301. The metal layer may include, but is not limited to aluminum (Al), aluminum alloy, silver (Ag), silver alloy, copper (Cu), copper alloy, molybdenum (Mo), molybdenum alloy, chromium (Cr), tantalum (Ta), titanium (Ti). The metal layer is patterned to form the gate electrode 310. The gate electrode 310 may have for example, an E-shape. Of course the gate electrode may be configured in other shapes. The gate electrode 310 may have at least two layers having different physical characteristics.

In an embodiment, the gate electrode 310 may include an upper layer, the upper layer including a metal that has a relatively low electric resistivity such as aluminum (Al), aluminum alloy, silver (Ag), silver alloy, copper (Cu), copper alloy, and the like, as well as combinations including at least one of the foregoing. The lower layer may include a material having a relatively good contact characteristic such as molybdenum (Mo), molybdenum alloy, chromium (Cr), tantalum (Ta), titanium (Ti), and the like, as well as combinations including at least one of the foregoing. The gate electrode 310 typically includes the lower layer including chromium (Cr) and the upper layer including aluminum neodymium alloy (AlNd), or the lower layer including aluminum neodymium alloy (AlNd) and the upper layer including molybdenum (Mo).

Then, a gate insulation layer 322 is formed on the substrate 301 as shown in FIGS. 7A-7C. The gate insulation layer 322 may be formed directly on the substrate 301 in portions between the gate electrode 310 and on the gate electrode 310 as shown in the exemplary embodiments of FIGS. 7A-7C. The gate insulation layer 322 may include, but is not limited to, silicon oxide (SiOx), silicon nitride (SiNx), or the like or any combination including at least one of the foregoing.

An active layer 324 including, but not limited to, amorphous silicon (a-Si:H) is formed on the gate insulation layer 322. Then an ohmic contact layer 326 including, but not limited to, n+ doped amorphous silicon (n+ a-Si:H) is formed on the active layer 324.

A metal layer including, but not limited to, refractory metal such as molybdenum (Mo), chromium (Cr), tantalum (Ta), titanium (Ti) is formed, and patterned to form the drain electrode 330 and the source electrode 340.

The drain electrode 330 is formed over the substrate 301. The drain electrode 330 may be configured in a similar manner as previously discussed with regard to the exemplary embodiment of FIG. 6. Other embodiments are also contemplated.

A portion of the ohmic contact layer 326, which is disposed between the drain and source electrodes 330 and 340, is removed by using the drain and source electrodes 330 and 340 as a mask. As best shown in FIG. 7B, the removal of the ohmic contact layer 326 may expose the active layer 324 between the drain electrode 333, 334, 336 and 337 and source electrode 342, 344, and 347 respectively.

Then, a protection layer 350 is formed on the substrate 301, the substrate having the drain and source electrodes 330 and 340 also formed thereon. Where a portion of the ohmic contact layer 326 has been removed as described above, and the active layer 324 exposed, the protection layer 350 may be formed directly on the active layer 324 as best shown in FIG. 7B. The protection layer 350 may include, but is not limited to, silicon nitride (SiNx), silicon oxide (SiOx), or the like, or any combination of at least one of the foregoing.

The a-Si TFT described above corresponds to an inversed staggered type TFT having a gate electrode is disposed under the drain and source electrodes. However, in other alternative embodiments, a structure of the exemplary a-Si TFT and exemplary method described above, may be applied to a staggered type TFT.

Hereinafter, another exemplary embodiment of an a-Si TFT capable of increasing a channel width and minimizing a parasitic capacitance Cgd will be explained. This exemplary a-Si TFT may be employed by a gate driving circuit of a display apparatus.

In an exemplary embodiment discussed above, the gate electrode 310 and the source electrode 340 include, for example, three gate hand portions and three source hand portions, respectively. However, in alternative embodiments, the gate electrode 310 and the source electrode 340 may have more than three gate hand portions, and more than three source hand portions, respectively.

As also described above in exemplary embodiments, the drain electrode 330 is formed in a region disposed over the gate electrode 310, and advantageously, a length of the drain electrode 330 may be reduced. Therefore, power consumption is reduced and a region margin for the TFT is increased.

Hereinafter, another exemplary embodiment of a liquid crystal display panel having a scan driving circuit that employs the above a-Si TFT will be explained.

Figure 8:
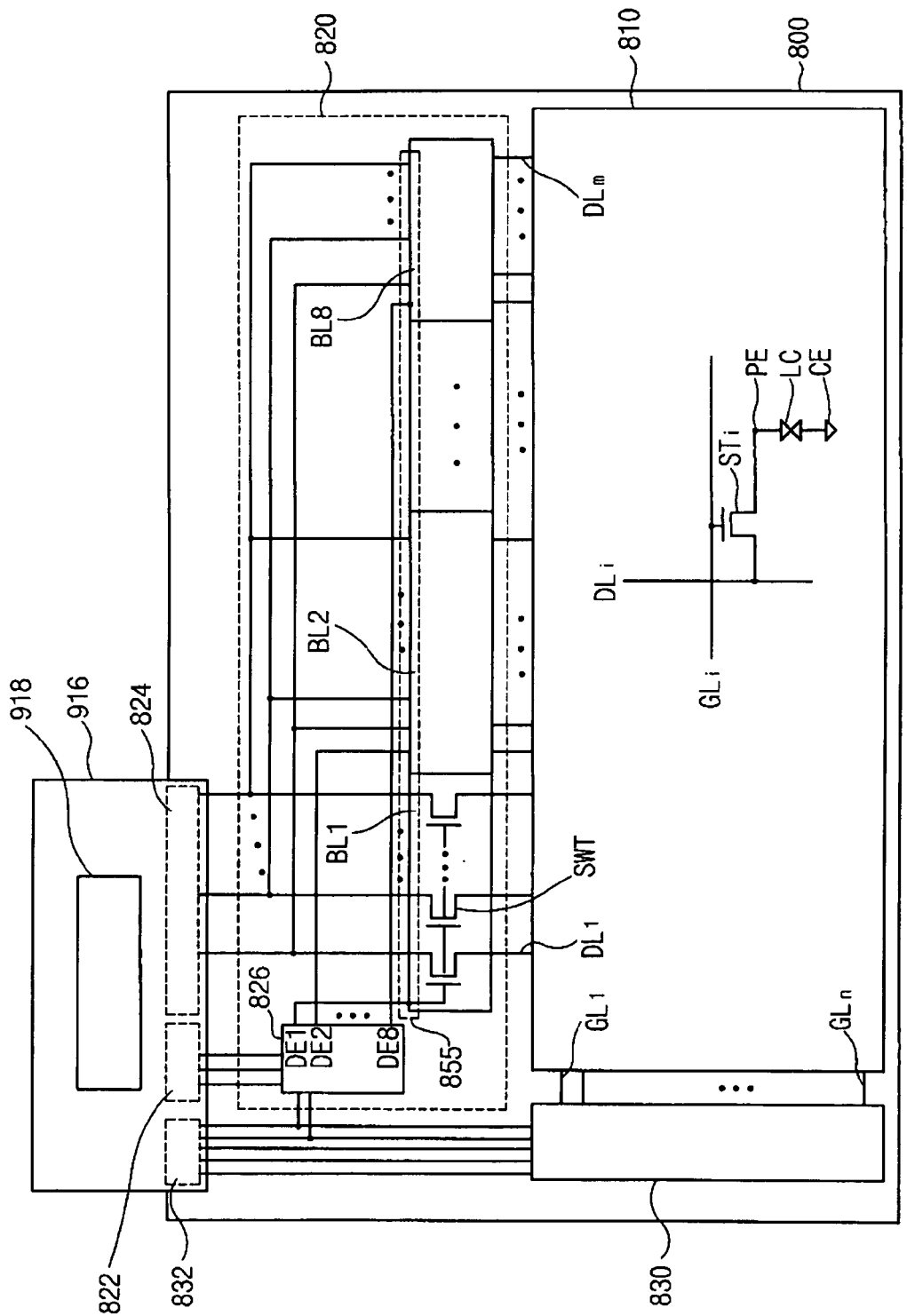
FIG. 8 is a block diagram illustrating an exemplary embodiment of a LCD device according to the present invention.

FIG. 8 is a block diagram illustrating an exemplary LCD device according to the present invention. Especially, FIG. 8 illustrates an array substrate of an LCD apparatus.

Figure 1:
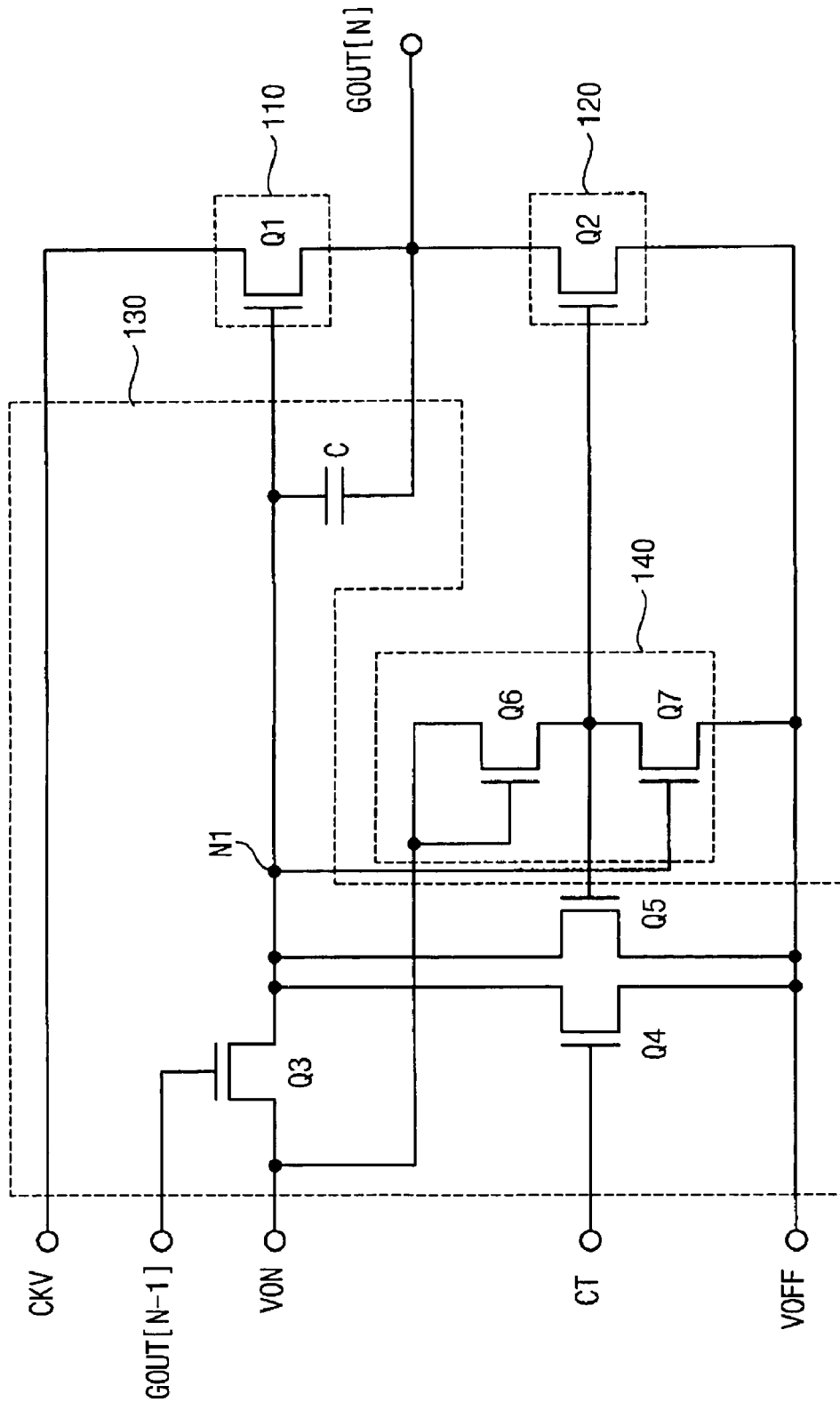
FIG. 1 is a circuit diagram illustrating a unit stage of a conventional shift register in the prior art.
Figure 3A:
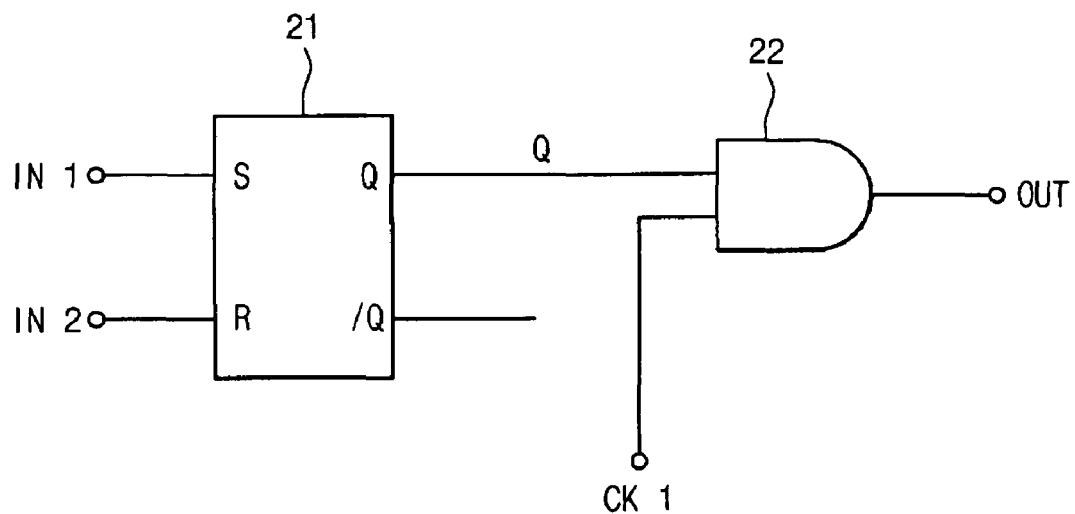
FIG. 3A is a circuit diagram illustrating a unit stage of the prior art in the conventional shift register in FIG. 1.
Figure 3B:
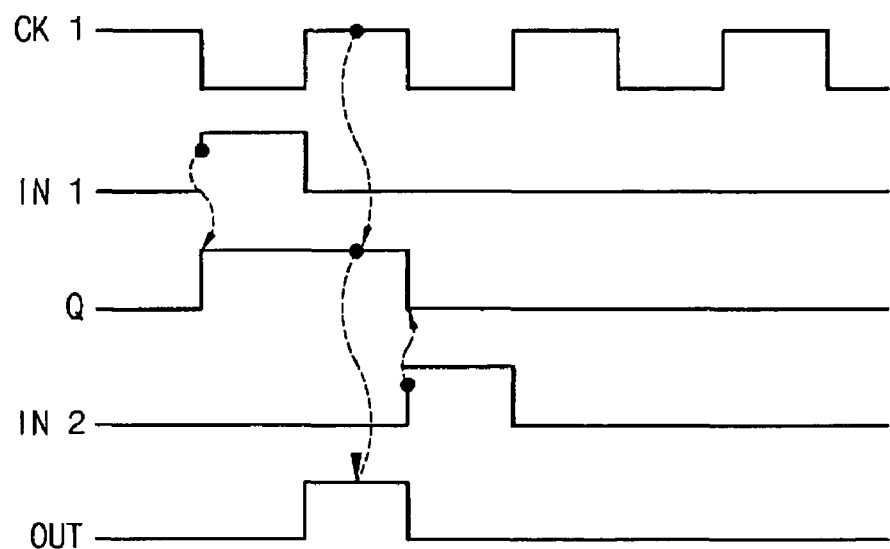
FIG. 3B is a timing diagram illustrating an operation of the unit stage in FIG. 3A.
Figure 3C:
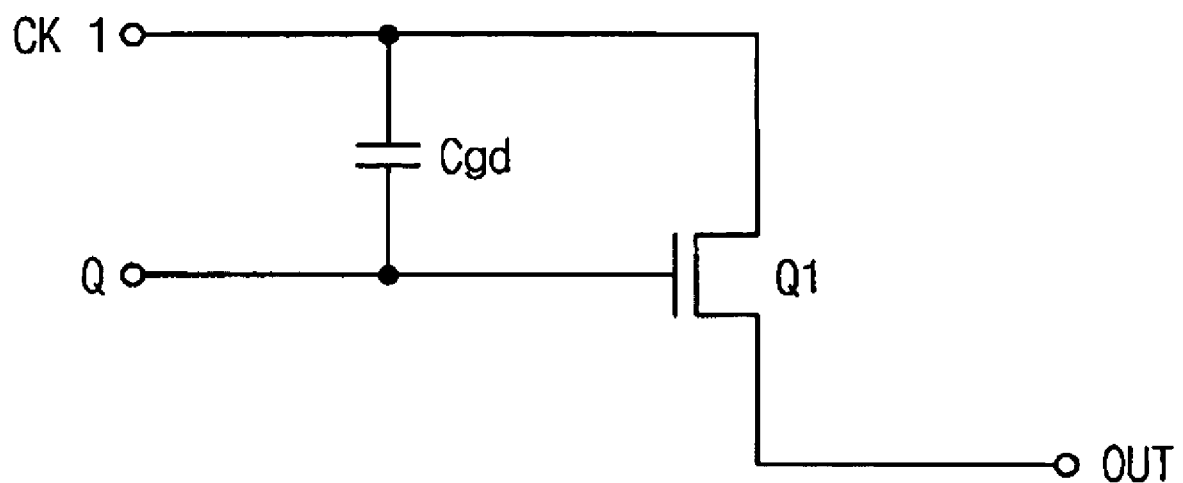
FIG. 3C is a circuit diagram illustrating a pull down transistor of the prior art sampling out a first clock signal in FIG. 3A.

Referring to FIG. 8, an exemplary array substrate 800 includes a display cell array circuit 810, a data driving circuit 820, a scan driving circuit 830 and a scan driving circuit connection terminal part 832. The data driving circuit 820, the scan driving circuit 830 and the scan driving circuit connection terminal part 832 may be formed through a process of manufacturing TFTs in the display cell array circuit 810. The scan driving circuit 830 corresponds to the shift register described in FIG. 2, and unit stages of the shift register are explained in FIG. 1.

A data driving chip 918 is formed on a flexible printed circuit 916 in the exemplary embodiment of FIG. 8. The data driving chip 918 is electrically connected to the array substrate 800 through the flexible printed circuit 916. The flexible printed circuit 916 provides the data driving circuit 820 with a data signal and a data timing signal. The flexible printed circuit 916 provides the scan driving circuit 830 with a gate signal and a gate timing signal.

The display cell array circuit 810 includes 'm' data lines DL1, DL2, . . . , DLm and 'n' gate lines GL1, GL2, . . . , GLn. The data lines DL1, DL2, . . . , DLm are extended along a first direction, and the gate lines GL1, GL2, . . . , GLn are extended along a second direction that is substantially perpendicular to the first direction.

The display cell array circuit 810 further includes a plurality of switching transistors ST arranged in a matrix shape. Each of the switching transistors ST includes a source electrode that is electrically connected to one of the data lines DL1, DL2, . . . , DLm, a gate electrode that is electrically connected to one of the gate lines GL1, GL2, . . . , GLn, and a drain electrode that is electrically connected to a pixel electrode PE. A common electrode CE formed at a color filter substrate is disposed over a pixel electrode PE, and a liquid crystal LC is disposed between the pixel electrode PE and the common electrode CE as shown in FIG. 8.

When the data signal is applied to the pixel electrode PE through the switching transistor ST, electric fields are generated between the pixel electrode PE and the common electrode CE to alter an arrangement of the liquid crystal LC. When the arrangement of the liquid crystal LC is altered, an optical transmittance is changed to display images.

The data driving circuit 820 includes the shift register 826 and 'N' switching transistors SWT. The 'N' switching transistors SWT are grouped into a selected number of groups, for example, eight data line blocks BL1, BL2, . . . , BL8, each having 'N/8' switching transistors.

The switching transistors SWT of the respective data line blocks BL1, BL2, . . . , BL8 are electrically connected to the input terminal part 824 including 'N/8' input terminals. The switching transistors of the respective data line blocks BL1, BL2, . . . , BL8 are also electrically connected to the data lines DL1, DL2, . . . , DLm.

Each of the switching transistors SWT includes a source electrode that is electrically connected to one of the data lines, a drain electrode that is electrically connected to one of the data input terminals of the input terminal part 824, and a gate electrode that is electrically connected to a block selection terminal 855.

Therefore, the 'm' data lines are grouped into eight data line groups. Each of the data line groups includes 'm/8' data lines. Each of the data input terminals is selected by a block selection signal in sequence.

The shift register 826 receives a first clock signal CKH, a second clock signal CKHB, and a block selection start signal STH through a connection terminal 822. Output terminals of the shift register 826 are electrically connected to block selection terminals, respectively.

In the exemplary embodiment, the a-Si TFT includes a portion of the source electrode, which has an U-shape, and is formed over a gate electrode, and a portion of the drain electrode, which has an I-shape, so that the channel width is increased with a fixed channel length. Therefore, a parasitic capacitance between the gate electrode and the drain electrode is decreased.

When the a-Si TFT has the above-mentioned structure having hand portions and finger portions, the channel width is further increased. Therefore, the parasitic capacitance may be further decreased.

Having described the exemplary embodiments of the present invention and its advantages, it is noted that various changes, substitutions and alterations can be made herein without departing from the spirit and scope of the invention as defined by appended claims. Moreover, the use of the terms first, second, etc. does not denote any order of importance, but rather the terms first, second, etc. are used to distinguish one element from another. Furthermore, the use of the terms a, an, etc. does not denote a limitation of quantity, but rather denotes the presence of at least one of the referenced item.

What is claimed is:

1. A transistor comprising:
    a control electrode formed on a substrate, the control electrode including a gate body portion, a first gate hand portion protruding from a first end of the gate body portion, and a second gate hand portion protruding from a second end of the gate body portion, the second gate hand portion being substantially parallel with the first gate hand portion;
    a first current electrode disposed between the first and second gate hand portions of the control electrode, the first current electrode being electrically insulated from the control electrode, the first current electrode partly overlapping with a portion of the control electrode;
    a second current electrode disposed over the control electrode and electrically insulated from the control electrode, the second current electrode partly overlapping with the first gate hand portion and the second gate hand portion of the control electrode; and
    a single unitary semiconductor layer including an active layer and an ohmic contact layer disposed on the active layer, the semiconductor layer being disposed between the control electrode and the first and second current electrodes, and overlapping an entire of the first current electrode disposed between the first and second gate hand portions of the control electrode, wherein the second current electrode partly surrounds the first current electrode to have a U-shape on the semiconductor layer disposed on the control electrode.

2. The transistor of claim 1, wherein the first current electrode is a drain electrode of the transistor and the second current electrode is a source electrode of the transistor.

3. The transistor of claim 1, wherein the first current electrode includes an I-shape structure partly overlapping with the first and second gate hand portions of the control electrode.

4. The transistor of claim 3, wherein the second current electrode includes the U-shape structure surrounding the I-shape structure of the first current electrode.

5. The transistor of claim 1, wherein a distance between the first current electrode and the second current electrode at a region that the second current electrode surrounds the first current electrode is a channel length of the transistor, and a distance along a middle of opposing faces between the first and second current electrodes at the region that the second current electrode surrounds the first current electrode is a channel width of the transistor.

6. The transistor of claim 1, wherein the semiconductor layer is exposed at a region between the first and second current electrodes.

7. The transistor of claim 1, wherein the active layer includes an amorphous silicon layer and the ohmic layer includes an n+ doped amorphous silicon layer.

8. A transistor comprising:
a control electrode that is formed in an E-shape on a substrate, the control electrode including a gate body portion and at least two gate hand portions protruding from the gate body portion, the gate hand portions separated from each other in a plan view of the control electrode;
a first current electrode that is electrically insulated from the control electrode, the first current electrode including at least one hand portion disposed over a region between the gate hand portions of the control electrode;
a second current electrode that is electrically insulated from the control electrode and spaced apart from the first current electrode, the second current electrode including at least one hand portion disposed at a region overlapping with corresponding one of the gate hand portions of the control electrode; and
a semiconductor layer including an active layer and an ohmic contact layer disposed on the active layer, the semiconductor layer being disposed between the control electrode and the first and second current electrodes,
wherein the second current electrode partly surrounds the first current electrode to have a U-shape on the semiconductor layer disposed on the control electrode.

9. The transistor of claim 8, wherein the hand portion of the first current electrode includes at least one finger portion overlapping with a hand portion of the control electrode.

10. The transistor of claim 9, wherein the hand portion of the second current electrode includes finger portions disposed over a hand portion of the control electrode, the finger portion of the first current electrode being surrounded by the finger portions and a part of the second current electrode.

11. The transistor of claim 8, wherein a distance between the first current electrode and the second current electrode at a region that the second current electrode surrounds the first current electrode is a channel length of the transistor, and at a distance along a middle of opposing faces between the first and second current electrodes at the region that the second current electrode surrounds the first current electrode is a channel width of the transistor.

12. The transistor of claim 8, wherein the first current electrode comprises:
a body portion extended toward the control electrode;
a hand portion protruding from the body portion of the first current electrode; and
a finger portion protruding from the hand portion of the first current electrode, the finger portion being disposed over the control electrode.

13. The transistor of claim 8, wherein the second current electrode comprises:
a body portion extended toward the control electrode;
a hand portion protruding from the body portion of the second current electrode; and
a finger portion protruding from the hand portion of the second current electrode;
wherein the hand portion and finger portion of the second current electrode are disposed over the control electrode.

14. The transistor of claim 8, wherein the first current electrode comprises a finger portion overlapping with the control electrode,
the second current electrode comprises a hand portion overlapping with the control electrode and a finger portion protruding from the hand portion of the second current electrode,
the hand portion of the second control electrode overlapping with the control electrode, and the finger portion of the first current electrode is surrounded by the hand portion and the finger portion of the second current electrode.

15. The transistor of claim 8, further comprising a semiconductor layer having an active layer and an ohmic contact layer disposed on the active layer, the semiconductor layer being disposed between the control electrode and the first and second current electrodes.

16. The transistor of claim 15, wherein the active layer includes an amorphous silicon layer and the ohmic contact layer includes an n+ doped amorphous silicon layer.

17. The transistor of claim 8, wherein the control electrode comprises:
a first gate hand portion protruding from a first end of the gate body portion;
a second gate hand portion protruding from a center of the gate body portion; and
a third gate hand portion protruding from a second end of the gate body portion, the third gate hand portion being opposite to the first end portion with respect to the second hand portion.

18. The transistor of claim 17, wherein the first current electrode includes:
a body portion disposed adjacent to the control electrode;
a first hand portion protruding from the body portion in a direction substantially perpendicular to the body portion, the first hand portion of the first current electrode being disposed over a region between the first and second gate hand portions of the control electrode; and
a second hand portion protruding from the body portion in a direction substantially parallel with the first hand portion of the first current electrode, the second hand portion of the first current electrode being disposed over a region between the second and third hand portions of the control electrode.

19. The transistor of claim 18, wherein the first hand portion of the first current electrode includes:
a first finger portion protruding from the first hand portion of the first current electrode in a direction substantially perpendicular to the first hand portion of the first current electrode, the first finger portion being disposed at a region overlapping with a part of the first hand portion of the control electrode; and a second finger portion protruding from the first hand portion of the first current electrode in a direction substantially opposite the first current electrode in a direction substantially opposite the first finger portion of the first current electrode, the second finger portion of the first current electrode being disposed at a region overlapping with a part of the second hand portion of the control electrode.

20. The transistor of claim 19, wherein the second hand portion of the first current electrode includes:

a third finger portion protruding from the second hand portion of the first current electrode in a direction substantially perpendicular to the second hand portion of the first current electrode, the third finger portion of the first current electrode being disposed at a region overlapping with a part of the second hand portion of the control electrode; and a fourth finger portion protruding from the second hand portion of the first current electrode in a direction substantially opposite the third finger portion of the first current electrode, the fourth finger portion of the first current electrode being disposed at a region overlapping with a part of the third hand portion of the control electrode.

21. The transistor of claim 17, wherein the second current electrode includes:

a body portion disposed over the body portion of the control electrode;

a first hand portion protruding from the body portion of the second current electrode in a direction substantially perpendicular to the body portion of the second current electrode, the first hand portion of the second current electrode being disposed at a region overlapping the first hand portion of the control electrode;

a second hand portion protruding from the body portion of the second current electrode in a direction substantially parallel with the first hand portion of the second current electrode, the second hand portion of the second current electrode being disposed at a region overlapping the second hand portion of the control electrode; and a third hand portion protruding from the body portion of the second current electrode in a direction substantially parallel with the first and second hand portions of the second current electrode, the third hand portion of the second current electrode being disposed at a region overlapping the third hand portion of the control electrode.

22. The transistor of claim 21, wherein the first hand portion of the second current electrode includes first finger portions each protruding from the first hand portion of the second current electrode in a direction substantially perpendicular to the first hand portion of the second current electrode;

the second hand portion of the second current electrode includes second finger portions each protruding from the second hand portion of the second current electrode in a direction substantially perpendicular to the second hand portion of the second current electrode, and third finger portions each protruding from the second hand portion of the second current electrode in a direction substantially opposite the second finger portions of the second current electrode; and the third hand portion of the second current electrode includes fourth finger portions each protruding from the third hand portion of the second current electrode in a direction substantially perpendicular to the third hand portion of the second current electrode.

23. The transistor of claim 22, wherein the first current electrode includes a first hand portion having first and second finger portions that are disposed at regions overlapping the first and second hand portions, respectively, of the control electrode, the first finger portion of the first current electrode being disposed between adjacent ones of the first finger portions of the second current electrode, and the second finger portion of the first current electrode being disposed between adjacent ones of the second finger portions of the second current electrode.

24. The transistor of claim 23, wherein the first current electrode includes a second hand portion having third and fourth finger portions that are disposed at regions overlapping the second and third hand portions, respectively, of the control electrode, the third finger portion of the first current electrode being disposed between adjacent ones of the third finger portions of the second current electrode, and the fourth finger portion of the first current electrode being disposed between adjacent ones of the fourth finger portions of the second current electrode.

* * * * *